(12) United States Patent
Maki et al.

(10) Patent No.: US 6,573,773 B2
(45) Date of Patent: Jun. 3, 2003

(54) CONFLICT FREE RADIATION TOLERANT STORAGE CELL

(75) Inventors: Gary Maki, Albuquerque, NM (US); Kenneth Haas, Albuquerque, NM (US); Shi Quan, Albuquerque, NM (US); James Murguia, Hollis, NH (US)

(73) Assignee: University of New Mexico, Albuquerque, NM (US)

( * ) Notice: Subject to any disclaimer, the term of this patent is extended or adjusted under 35 U.S.C. 154(b) by 0 days.

(21) Appl. No.: 09/776,453

(22) Filed: Feb. 2, 2001

(65) Prior Publication Data

US 2001/0033189 A1 Oct. 25, 2001

Related U.S. Application Data

(60) Provisional application No. 60/180,377, filed on Feb. 4, 2000.

(51) Int. Cl.[7] .......................... H03K 3/12; H03K 3/286
(52) U.S. Cl. ................. 327/200; 327/208; 365/154
(58) Field of Search .................. 365/154, 156, 365/181; 327/199, 200, 202, 203, 208

(56) References Cited

U.S. PATENT DOCUMENTS

| 4,782,467 A | 11/1988 | Belt et al. ................ 365/154 |
| 4,797,804 A | 1/1989 | Rockett, Jr. ............... 365/154 |
| 4,852,060 A | 7/1989 | Rockett, Jr. ............... 365/154 |
| 5,039,876 A | 8/1991 | Hochwald et al. .......... 307/278 |
| 5,111,429 A | 5/1992 | Whitaker ................... 365/156 |
| 5,157,625 A | 10/1992 | Barry ........................ 365/154 |
| 5,307,142 A | 4/1994 | Corbett et al. ............. 365/156 |
| 5,311,070 A | 5/1994 | Dooley ..................... 307/279 |
| 5,406,513 A | 4/1995 | Canaris et al. ............ 365/181 |
| 5,436,572 A | 7/1995 | Sugiyama .................. 326/12 |
| 5,640,341 A | 6/1997 | Bessot et al. ............. 365/156 |
| 5,870,332 A | 2/1999 | Lahey et al. .............. 365/156 |
| 5,940,318 A | 8/1999 | Bessot ..................... 365/154 |
| 6,326,809 B1 * | 12/2001 | Gambles et al. ........... 365/154 |

* cited by examiner

Primary Examiner—Tuan T. Lam
(74) Attorney, Agent, or Firm—Haverstock & Owens LLP

(57) ABSTRACT

A Single Event Upset (SEU) resistant latch circuit that uses the Single Event Resistant Topology (SERT) comprises a first circuit module electrically coupled to a second circuit module. In the SERT-1 embodiment, the first circuit module has two output terminals, including four cross-coupled p-channel (PMOS) transistors coupled with two n-channel (NMOS) transistors. The second circuit module has two output terminals, including four cross-coupled p-channel (PMOS) transistors coupled with two n-channel (NMOS) transistors. These four output terminals satisfy a set of state equations that can be used to obtain the SERT-1 State Table. In the SERT-2 embodiment, the first circuit module has two output terminals, including four cross-coupled n-channel (NMOS) transistors coupled with two p-channel (PMOS) transistors. The second circuit module has two output terminals, including four cross-coupled n-channel (NMOS) transistors coupled with two p-channel (PMOS) transistors. These four output terminals satisfy a set of state equations that can be used to obtain the SERT-2 State Table.

8 Claims, 7 Drawing Sheets

|  Y₂Y₃ \ Y₀Y₁ | 00 | 01 | 11 | 10 |
|---|---|---|---|---|
| 00 | 1111 | 11Z1 | 1100 | 111Z |
| 01 | 1Z11 | 1ZZ1 | 1Z00 | 1Z1Z |
| 11 | 0011 | 00Z1 | 0000 | 001Z |
| 10 | Z111 | Z1Z1 | 1Z00 | Z11Z |

Fig. 10

CONFLICT FREE RADIATION TOLERANT STORAGE CELL

RELATED APPLICATIONS

This application claims priority under 35 U.S.C. §119(e) of the co-pending U.S. provisional application Ser. No. 60/180,377 filed on Feb. 4, 2000 and entitled "Conflict Free Radiation Tolerant Storage Cell." The provisional application Ser. No. 60/180,377 filed on Feb. 4, 2000 and entitled "Conflict Free Radiation Tolerant Storage Cell" is also hereby incorporated by reference.

FIELD OF THE INVENTION

The present invention relates to a Single Event Upset (SEU) resistant circuit. More specifically, the present invention uses n-channel and p-channel transistors in a latch cell design to achieve a latch cell resistant to SEU.

BACKGROUND OF THE INVENTION

Radiation can have detrimental effects on electronics, including immediate temporary information upset and increased power consumption as a circuit responds to a single event upset (SEU) event. Ionizing radiation occurs in the form of charged particles that possess enough energy to break atomic bonds and create electron/hole pairs in the absorbing material. Such particles may include protons, electrons, atomic ions, and photons with energies greater than the material band gaps. The primary ionizing radiation effects on microelectronics can be categorized as either total ionizing dose (TID) effects or transient effects. TID effects are a function of ionizing radiation accumulation over months or even years, which can lead to performance degradation and functional failure. Transient radiation effects are primarily the result of photo-currents generated as energetic particles pass through the circuit.

The SEU occurs when the charge collected as a result of the generated photo currents is of sufficient magnitude to alter the logic state of a susceptible node. An upset node may further cause the alteration of the contents of circuit memory elements or alter the operation of the circuit in such a way to cause an error in a logic function.

There are existing designs that mitigate SEU events. One such design is known as the DICE Memory Cell 10 shown in FIG. 1. An analysis of this circuit is illustrated in a state table shown in FIG. 2. The inputs for each of the y0 and y1 nodes of FIG. 1 are shown on the horizontal line above the chart. The inputs for each of the y2 and y3 nodes of FIG. 1 are shown in the vertical line to the left of the chart. The resulting state for each of the four nodes y0, y1, y2 and y3, are shown in each corresponding box in the chart. The stable states (normal operation state) are 0101 and 1010 because at these input states the DICE cell retains its input state at the output nodes. In normal operation, the circuit transitions between these two states.

An entry of X in the chart represents a conflict condition in that both transistors shown in a stack of FIG. 1 are conditioned to conduct. Thus, the upper transistor attempts to pull the node high, while the lower transistor attempts to pull the node low. This also causes the circuit to draw excessive current. Likewise, an entry of Z in the chart represents a high impedance condition in that both transistors in a stack are conditioned to be in a cut-off mode. Thus, the node floats, and retains its condition because of the node's capacitance. When the NMOS devices are stronger than the PMOS devices, all the X states are changed to 0 since the NMOS transistor will win the conflict state although higher than normal current still exist during the conflict.

It is possible to predict the action of the circuit state given the next state table. By way of example of the operation of the DICE memory cell, the circuit is assumed to be in the stable state 0101 while an SEU event occurs that changes y2. Therefore the stable state is changed to 0111. The next state entry for 0111 is 000Z, (assuming that the NMOS devices are stronger) which means the circuit will be driven to 0001, but will consume higher than normal supply current in order to resolve the conflict. Not all variables change at the same instant. Suppose state variable $y_1$ changes to a 0 first causing the circuit to enter state 0011, which has a next state entry of Z00Z. Only state variables $y_1$ and $y_2$ are driven, in this case to 0, but $y_1$ already is 0. Therefore only $y_2$ will change causing the circuit to assume 0001, which has a next state entry of Z101. Next state variable $y_1$ will be excited to change forcing the circuit back to the original state 0101. In the process of this set of transitions, the circuit has entered three unstable states (0111, 0011, 0001) before returning to the stable state. In these three unstable states, there were a total of 4 conflicts (4 sets of NMOS and PMOS devices that are both turned on). In addition, three transition times were needed to return the circuit to its stable state. The DICE Cell 10 draws a large amount of current because the circuit has to go through many high-current transitions from an unstable to a stable state.

Another design aimed to mitigate the SEU is the Whitaker design shown in FIG. 3. In the U.S. Pat. No. 5,111,429, entitled, "Single Event Upset Hardening CMOS Memory Circuit" by Whitaker, the inventor shows that the Whitaker cell 30 is a 4-state variable asynchronous circuit that has the capability of resisting the forces of an SEU. However, in this design, there are also many conflicts. A difference between the Whitaker cell 30 and the DICE Cell 10 is that the Whitaker cell 30 takes advantage of the knowledge that SEU induced current flows in known directions associated with PMOS and NMOS devices respectively. Therefore, two of the state variables are realized with only PMOS devices and the other two state variables are realized with only NMOS devices. The state variables implemented with PMOS (NMOS) devices cannot experience an SEU failure which causes a 1 to 0 (0 to 1) transition. In addition to increasing current during conflicts, the Whitaker cell 30 produces degraded signal levels due to the presence of PMOS pull-down devices (pass Vss through a PMOS transistor) and the presence of NMOS pull-up devices (pass Vdd through an NMOS transistor). These degraded signal levels mean that some transistors are never fully off and they have significant static leakage current. Therefore, there are two sources of increased current relative to classical CMOS designs. The first source is the conflicts in the design itself, and the second source is the state variables which are composed of only PMOS or only NMOS devices. There are two aspects of the prior art design that make it disadvantageous for ultra low power applications. First, the degraded logic levels inside the storage cell make it more difficult to lower the supply voltage. For example, if a PMOS transistor is used as a pull-down then the resulting logic level will be no lower than one transistor threshold above ground. If this signal is then used to drive a second PMOS transistor with its source at $V_{dd}$, then $V_{dd}$ must be made somewhat greater than twice the transistor threshold so that the degraded 0 will be low enough to enable the second PMOS device. If there are no degraded signals then $V_{dd}$ can be lowered to a level somewhat greater than one transistor threshold. Since dynamic power consumption is proportional to the square of the supply voltage this can provide a significant savings.

Second, operation at very low supply voltage requires that transistors have correspondingly low threshold voltages. As a consequence, the sub-threshold leakage of these transistors may be quite large, perhaps as much as 10% of the transistor's saturation current. Any circuit that relies on relative transistor strength ratios, such as the prior art DICE 10 and Whitaker cells 30, will not function well under these conditions. Suppose that a circuit is designed so that conflicts between a pull-up transistor and a pull-down transistor always resolve to a zero "0", and the pull-down transistor is made five times stronger to accomplish this goal. The sub-threshold leakage through this transistor, at 10% of its saturation current, will be equal to half of the saturation current of the weak pull-up, and the pull-up transistor will be unable to create a correct "1" level. Decreasing the strength of the pull-down transistor allows the pull-up transistor to create a higher "1" level but makes it more difficult for the pull-down to properly resolve conflict to a "0" state. At best, the prior art circuit will operate very slowly and at worst it will cease to function.

To overcomes these problems, Barry and Dooley in U.S. Pat. No. 5,157,625 by Barry and in U.S. Pat. No. 5,311,070 by Dooley tried to overcome the problems in the Whitaker and DICE cells related to conflict states and degraded signal levels. Furthermore, the Barry/Dooley cell succeeded in recovering from a single fault event with only one transition. The generalized design equations are:

$$y_0 = y_2' y_3'(1) + y_2 y_3(0)$$

$$y_1 = y_2' y_3'(1) + y_2 y_3(0)$$

$$y_2 = y_0' y_1'(1) + y_0 y_1(0)$$

$$y_3 = y_0' y_1'(1) + y_0 y_1(0)$$

The first term on the right hand side of the first equation, $y_2' y_3'(1)$ indicates the conditions that will cause $y_0$ to be driven to the 1 state. In this case $y_0$ is driven to 1 when both $y_2$ and $y_3$ are low. The second term on the right hand side of the first equation, $y_2 y_3(0)$, indicates the conditions that will cause $y_0$ to be driven to the 0 state. In this case $y_0$ is driven to 0 when both $y_2$ and $y_3$ are high. It is impossible to drive $y_0$ to the 1 and 0 states simultaneously, so node 0 is free of conflicts. However, if $y_2$ and $y_3$ are in opposite states then $y_0$ is not driven and is left in a high impedance state, holding its previous logic level by virtue of the capacitance on this node.

The stable states in the Barry/Dooley design are 1100 and 0011. This design can transition only a distance one from a stable state upon an impact of an SEU. The letter Z denotes high impedance state for the given state variable. In this design, NMOS transistors pass only 0 and PMOS transistors pass only 1. To illustrate SEU tolerance, consider the design equations and the following. Let the circuit to be in state $y_0 y_1 y_2 y_3 = 1100$. Assume an SEU causes $y_0$ to be transitioned from 1 to 0. The circuit would transition to 0100 at which time both $y_2$ and $y_3$ go to the high impedance state and the circuit transitions to 01ZZ. The charge on $y_2$ and $y_3$ will hold these two nodes at the 0 state, hence the circuit remains stable until the SEU effect is removed. Once the SEU effect is removed, the charge on the nodes $y_2$ and $y_3$ will force $y_0$ to the 1 state and force the circuit back to 1100; next state variable $y_2$ and $y_3$ are actively driven to 0 and this state once again is stable.

Consider the example where an SEU causes $y_2$ to transition from 0 to 1. The circuit transitions to 1110 at which time both $y_0$ and $y_1$ go to the high impedance state and the circuit transitions to ZZ10. The charge on the nodes for $y_0$ and $y_1$ will keep $y_3$ active at the 0 state, hence the circuit remains stable until the SEU effect is removed. Once the SEU effect is removed, the charge on the nodes for $y_0$ and $y_1$ will force $y_2$ to the 0 state and force the circuit back to 1100; next state variables $y_0$ and $y_1$ are forced to 1.

The Dooley/Barry design has more transistors, and hence a greater area than is necessary.

Therefore, what is needed is an invention that has no conflict states, is relatively insensitive to the relative sizes of the transistors in the cell and uses a fewer number of transistors.

SUMMARY OF THE INVENTION

The present invention in its preferred embodiment represents the circuit design configuration called Single Event Resistant Topology (SERT) to achieve a low-power SEU tolerant circuit using fewer transistors than the prior art. Within the SERT configuration, the circuit operation is insensitive to the relative sizes of the transistors in the cell. There are two essentially equivalent embodiments of the SERT cell. The first embodiment or SERT-1 comprises 8 PMOS transistors cross-coupled to four NMOS load transistors. The second embodiment or SERT-2 comprises 8 NMOS transistors cross-coupled to four PMOS load transistors.

The nature, principle and utility of the present invention will become more apparent from the following detailed description when read in conjunction with the accompanying drawings.

BRIEF DESCRIPTION OF THE DRAWINGS

FIG. 10 is the SERT-2 State Table.

DETAILED DESCRIPTION OF THE PRESENT INVENTION

SERT-1 Circuit Structure and Analyses

Figures 1, 2:
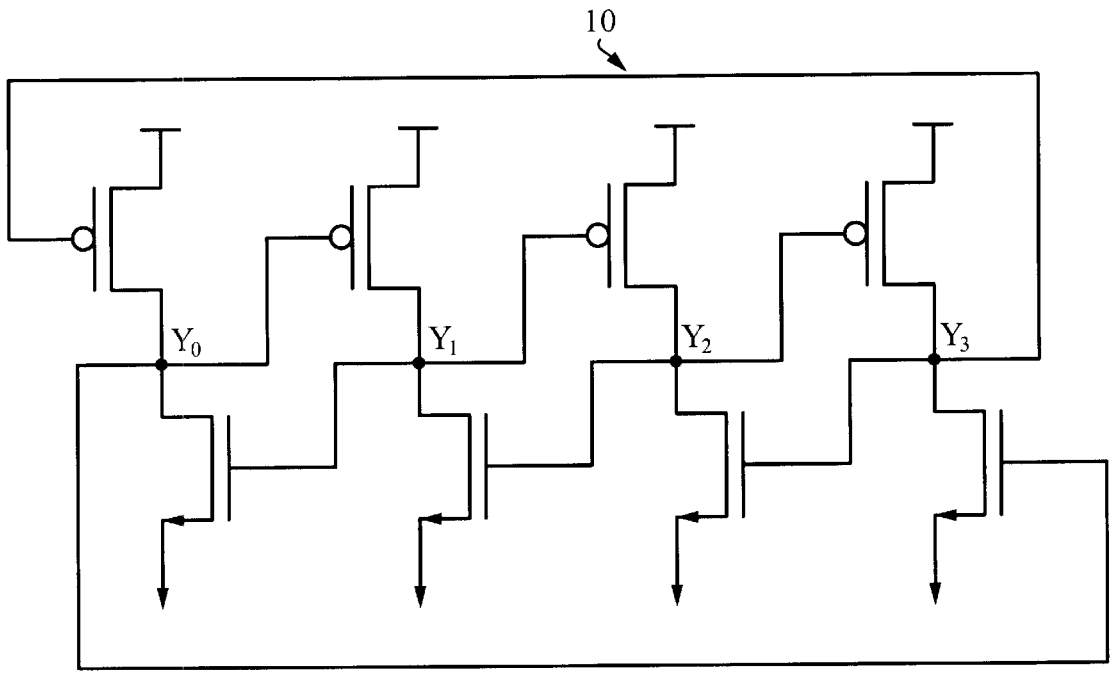
FIG. 1 is a schematic diagram of the DICE Memory Cell.
FIG. 2 is a DICE Memory Cell State Table.
Figures 3, 4:
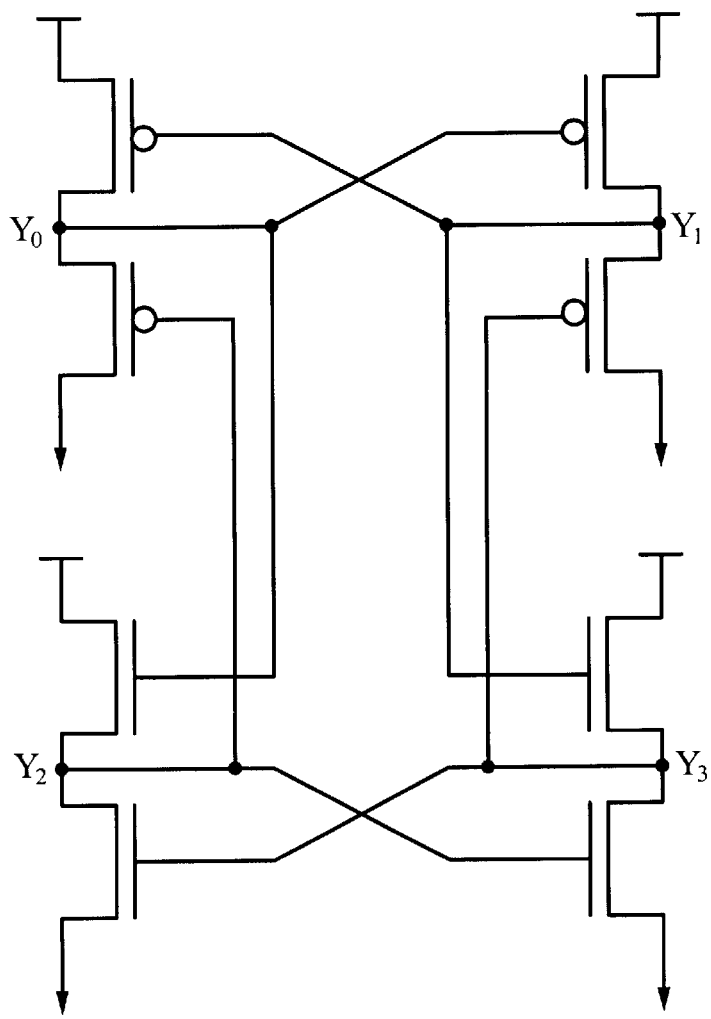
FIG. 3 is a schematic diagram of the Whitaker Cell.
FIG. 4 is a Whitaker Cell State Table.
Figure 5:
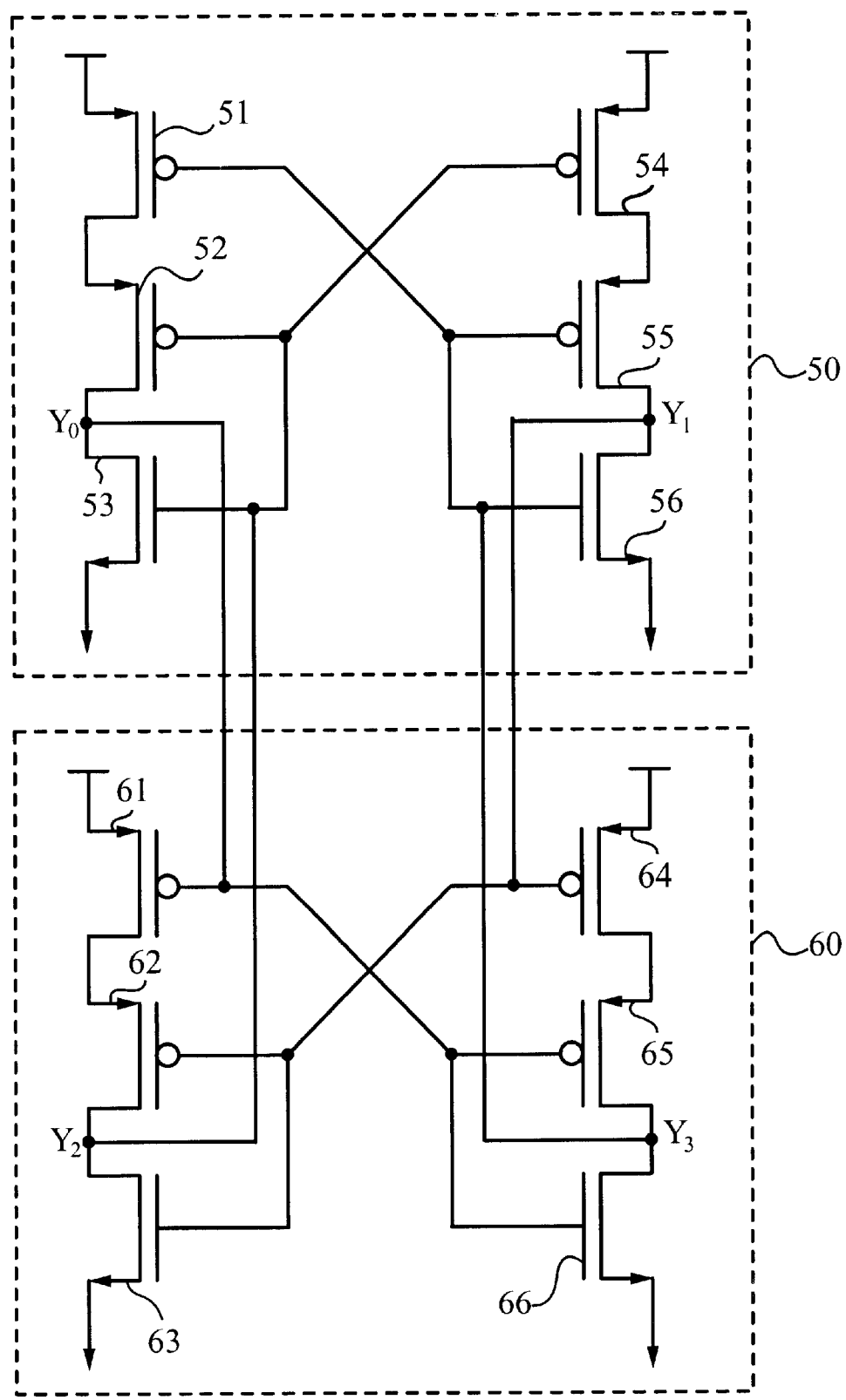
FIG. 5 is the schematic diagram of the first embodiment of the present invention, or the SERT-1.

Referring to FIG. 5, the present invention includes a first circuit module 50 having four cross-coupled p-channel (PMOS) transistors coupled to two n-channel (NMOS) load transistors. The first circuit module 50 includes two output terminals coupled as inputs to a second circuit module 60.

A second circuit module 60 includes four cross-coupled p-channel (PMOS) transistors which are coupled to two n-channel (NMOS) load transistors. The second circuit module 60 includes two output terminals coupled as inputs to the first circuit module 50.

Each transistor has a source, drain, and a gate. The four cross-coupled p-channel (PMOS) transistors in the first circuit module 50 include a first PMOS transistor 51 having its source coupled to a power supply potential, a second PMOS transistor 52 having its source coupled to the drain of the first PMOS transistor 51, a third PMOS transistor 54 having its source coupled to the power supply potential, its gate is coupled to the gate of the second PMOS transistor 52, a fourth PMOS transistor 55 having its source coupled to the drain of the third PMOS transistor 54, its gate coupled to the gate of the first PMOS transistor 51. The first circuit module 50 also includes two n-channel (NMOS) transistors. A first NMOS transistor 53 having its source coupled to a ground potential, its drain coupled to the drain of the second PMOS transistor 52 forming a first output terminal $y_0$, and its gate coupled to the gate of the second PMOS transistor 52. A second NMOS transistor 56 having its source coupled to the electrical ground potential, its drain coupled to the drain of the fourth PMOS transistor 55, forming a second output terminal $y_1$, and its gate coupled to the gate of the fourth PMOS transistor 55.

The output $y_0$ of the first circuit module 50 is coupled as an input to the second circuit module 60. The second circuit module 60 is preferably the same as the first circuit module 50 in term of structure. The second circuit module 60 includes four cross-coupled p-channel (PMOS) transistors coupled to two n-channel (NMOS) transistors. The four cross-coupled PMOS transistors of the second circuit module 60 include a fifth PMOS transistor 61 having its source coupled to the power supply, a sixth PMOS transistor 62 having its source coupled to the drain of the fifth PMOS transistor 61, a seventh PMOS 64 having its source coupled to the power supply, its gate coupled to the gate of the sixth PMOS transistor 62, and an eighth PMOS transistor 65 having its source coupled to the drain of the seventh PMOS transistor 64, its gate coupled to the gate of the fifth PMOS transistor 61. The two n-channel (NMOS) transistors of the second circuit module 60 comprise a third NMOS transistor 63 having its source coupled to the ground potential, its drain coupled to the drain of the sixth PMOS transistor 62 forming a third output terminal $y_2$, and its gate coupled to the gate of the sixth PMOS transistor 62. The fourth NMOS transistor 66 having its source coupled to the ground potential, its drain coupled to the drain of the eighth PMOS transistor 65 forming a fourth output terminal $y_3$, and its gate coupled to the gate of the eighth PMOS transistor 65. The first output terminal $y_0$ is coupled to the gate of the fifth PMOS transistor 61 of the second circuit module 60. The second output terminal $y_1$ is coupled to the gate of the seventh PMOS transistor 64 of the second circuit module 60. The third output terminal $y_2$ is coupled to the gate of the first NMOS transistor 53 of the first circuit module 50. The fourth output terminal $y_3$ is couple to the gate of the second NMOS transistor 56 of the first circuit module 50.

The output terminals y0, y1, y2, y3 of the above circuit configuration, SERT-1, also called state variables, satisfy the following set of state equations:

$$y_0 = y'_2 y'_3 (1) + y_2 (0) \quad [1]$$

$$y_1 = y'_2 y'_3 (1) + y_3 (0) \quad [2]$$

$$y_2 = y'_0 y'_1 (1) + y_1 (0) \quad [3]$$

$$y_3 = y'_0 y'_1 (1) + y_0 (0). \quad [4]$$

Whereas, $y_k'$ is the inverse of the state variable k, k=0,1,2,3. If $y_k=1$, then $y_k'=0$, and vice versa.

In the first equation [1], the first term on the right hand side of the equal sign, $y'_2 y'_3 (1)$ indicates the conditions that will cause $y_0$ to be driven to the 1 state. In this case $y_0$ is driven to 1 when both $y_2$ and $y_3$ are low (0) or when their inversions, $y_2'$ and $y_3'$ are both high (1). However, it is impossible to drive $y_0$ to the 1 and 0 state simultaneously, so output terminal $y_0$ is free of conflicts. However, if $y_2$ and $y_3$ are in opposite states then $y_0$ is not driven and is left in a high impedance state, holding its previous logic level by the capacitance on its terminal. The second term on the right hand side, $y_2(0)$ indicates the condition that will cause $y_0$ to be driven to the 0 state.

In the second equation [2], $y_1$ is shown to be driven to the 0 state when $y_3$ is in the high (1) state. $y_1$ is driven to the 1 state when both $y_2'$ and $y_3'$ are high. When $y'_2$ and $y'_3$ are in opposite states, $y_1$ is left in a high impedance state, holding its previous logic level by the capacitance on its terminal.

In the third equation [3], $y_2$ is shown to be driven to the 0 state when $y_1$ is in the high (1) state. $y_2$ is driven to the 1 state when both $y'_0$ and $y'_1$ are high. When $y'_0$ and $y'_1$ are in opposite states, $y_2$ is left in a high impedance state, holding its previous logic level by the capacitance on its terminal.

In the fourth equation [4], $y_3$ is shown to be driven to the 0 state when $y_0$ is in the high (1) state. $y_3$ is driven to the 1 state when both $y_0'$ and $y_1'$ are high. When $y'_0$ and $y'_1$ are in opposite states, $y_3$ is left in a high impedance state, holding its previous logic level by the capacitance on its terminal.

Figure 6:
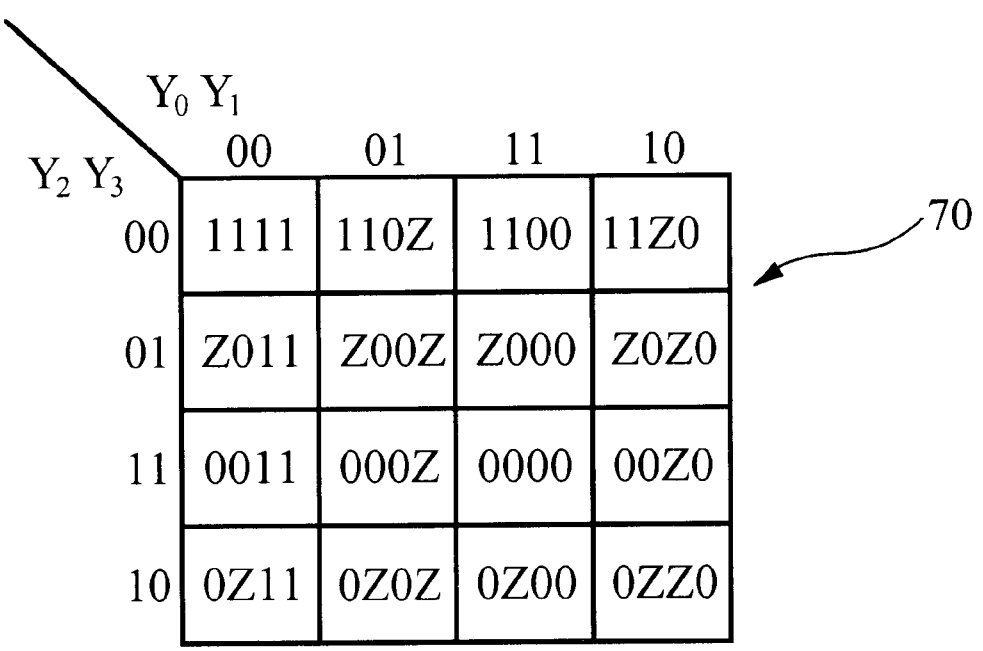
FIG. 6 is SERT-1 State Table

From these four equations the state table for the circuit SERT-1 can be obtained as shown in the table of FIG. 6. For example, initially when $y_0=0$, $y_1=0$, $y_2=0$, and $y_3=0$, corresponding to the first row and first column of the state table, the inverse of the output nodes are all high states 1: $y_0'=1$, $y_1'=1$, $y_2'=1$, and $y_3'=1$. Thus, the first terms of the above equations give us the next states are 1,1,1,1 as indicated in the state table of FIG. 6.

Next, consider when the output terminals are all 1. That is $y_0=1$, $y_1=1$, $y_2=1$, and $y_3=1$. The second terms of the above equations indicate that the next states are all low states, or $y_0=0$, $y_1=0$, $y_2=0$, and $y_3=0$. This example is the entry in row 3, and column 3 of the SERT-1 State Table shown in FIG. 6. As another example, consider a case when $y_0=1$, $y_1=1$, $y_2=0$, and $y_3=0$. The above equations indicate that $y_2=0$ and $y_3=0$ by virtue of the second terms of Equations [3] and [4]. The first terms of Equations [1] and [2] indicate that give $y_0=1$ and $y_1=1$ because $y_2'y_3'$ are both high. Thus, the next state for $y_0=1$, $y_1=1$, $y_2=0$, and $y_3=0$ is $y_0=1$, $y_1=1$, $y_2=0$, and $y_3=0$, unchanged, corresponding to the state shown in column 3, row 1 of the SERT-1 State Table. In a another example, when in the initial states $y_0=1$, $y_1=0$, $y_2=1$, and $y_3=0$, the above Equations [1] and [4] second terms give the next state for $y_0$ is 0 because $y_2$ is 1, and the next state for $y_3$ is 0 because $y_0$ is 1. Because $y_2'$, $y_3'$ and $y_0'$ and $y_1'$ are in conflict states, Equations [2] and [3] indicate that the next states for $y_1$ and $y_2$ are high impedance states Z. These next states 0ZZ0 corresponding to the state in the fourth row and fourth column of the SERT1 State Table. Thus, from Equations [1] to [4], a person skilled in the pertinent art can generate the complete SERT-1 State Table as shown in FIG. 6.

The SERT-1 State Table can also be obtained by using the SERT-1 schematic diagram shown in FIG. 5. For example, when $y_0=0$, $y_1=0$, $y_2=0$, and $y_3=0$, the PMOS transistor 51 is ON, the PMOS transistor 52 is ON, and the NMOS transistor 53 is OFF, which drives $y_0$ to the high state. Likewise, the PMOS transistor 54 is ON, the PMOS transistor 55 is ON, and the NMOS transistor 56 is OFF, driving $y_1$ to a high state. Similarly, the PMOS transistor 61 is ON, the PMOS transistor 62 is ON, and the NMOS transistor 63 is OFF, driving $y_2$ to a high state 1. Likewise, the PMOS transistor 64 is ON, the PMOS transistor 65 is ON, and the NMOS transistor 66 is OFF, driving $y_3$ to a high state 1. Thus, the next states are 1,1,1, corresponding to column 1, row 1 of the SERT-1 State Table and exactly the same result as obtained from Equations [1]–[4].

In a second example consider $y_0=1$, $y_1=1$, $y_2=1$, and $y_3=1$, which corresponds to the cell from third row and the third column of the SERT-1 State Table. The PMOS transistor 51 is OFF, the PMOS transistor 52 is OFF, and the NMOS transistor 53 is ON, driving $y_0$ to a low state. Also, the PMOS transistor 54 is OFF, the PMOS transistor 55 is OFF, and the NMOS transistor is ON, driving output terminal $y_1$ to a low state. Likewise, the PMOS transistor 61 is OFF, the PMOS transistor 62 is OFF, and the NMOS transistor 63 is ON, driving the output terminal $y_2$ to a low state. Also, the PMOS transistor 64 is OFF, the PMOS transistor 65 is OFF, and the NMOS transistor 66 is ON, driving the output terminal $y_3$ to a low state. Thus, the next states are 0000.

When $y_0=1$, $y_1=1$, $y_2=0$, and $y_3=0$, the PMOS transistor 51 is ON, the PMOS transistor 52 is ON, and the NMOS transistor 53 is OFF, driving output terminal $y_0$ to a high state. The PMOS transistor 54 is ON, the PMOS transistor 55 is ON, and the NMOS transistor 56 is OFF, driving output terminal $y_1$ to a high state. The PMOS transistor 61 is OFF, the PMOS transistor 62 is OFF, and the NMOS transistor 63 is ON, driving the terminal output $y_2$ to a low state. The PMOS transistor 64 is OFF, the PMOS transistor 65 is OFF, and the NMOS transistor 66 is ON, driving the fourth output terminal $y_3$ to a low state. Thus, the next states are 1100, which is a stable state of the SERT-1.

When $y_0=1$, $y_1=0$, $y_2=1$, and $y_3=0$, the PMOS transistor 51 is ON, the PMOS transistor 52 is OFF, and the NMOS transistor 53 is ON, driving the terminal output $y_0$ to a low state. The PMOS transistor 54 is OFF, the PMOS transistor 55 is ON, and the NMOS transistor 56 is OFF, driving the terminal output y, to a high impedance state Z. The PMOS transistor 61 is OFF, the PMOS transistor 62 is ON, and the NMOS transistor 63 is OFF, driving the output terminal $y_2$ to a high impedance state Z. The PMOS transistor 64 is ON, the PMOS transistor 65 is OFF, and the NMOS transistor 66 is ON, driving the output terminal $y_3$ to a low state. Thus, the outputs are 0ZZ0.

By using the same methods above, a person skilled in the art can obtain the complete SERT-1 State Table 70, shown in FIG. 6.

SERT-1 Recovering from an SEU Event.

The SERT-1 State Table 70 shows that the SEU resistant circuit has two stable states 0011 and 1100. A stable state is a state where the circuit retains its initial input values at its terminal outputs. For a description of the stable operation, assume the stable state of the circuit is 1100.

There are two basic cases to consider. In a first case, when an SEU event forces the circuit to assume a state of distance exactly one from the stable state; and when the SEU effect is gone, the circuit transitions back to stable state. In this case, there are only two state transitions, as shown in a simplified State Table 80 in FIG. 7. First, when an SEU event occurs, the state 1100 is changed to 0100. The first transition occurs when an SEU causes the node $y_0$ to be forced to change from 1 to 0. When the node $y_0$ transitions to 0, the node $y_3$ transitions to the high impedance state Z; the next state excitation is 110Z. This transient state is effectively 1100 since $y_3$ has been low as there is a finite amount of time required for a node to change state when in a high impedance condition owing to the capacitance of the node. However, the SEU event does not allow the node $y_0$ to rise to a 1 and therefore the present state remains at 0100.

Figure 7:
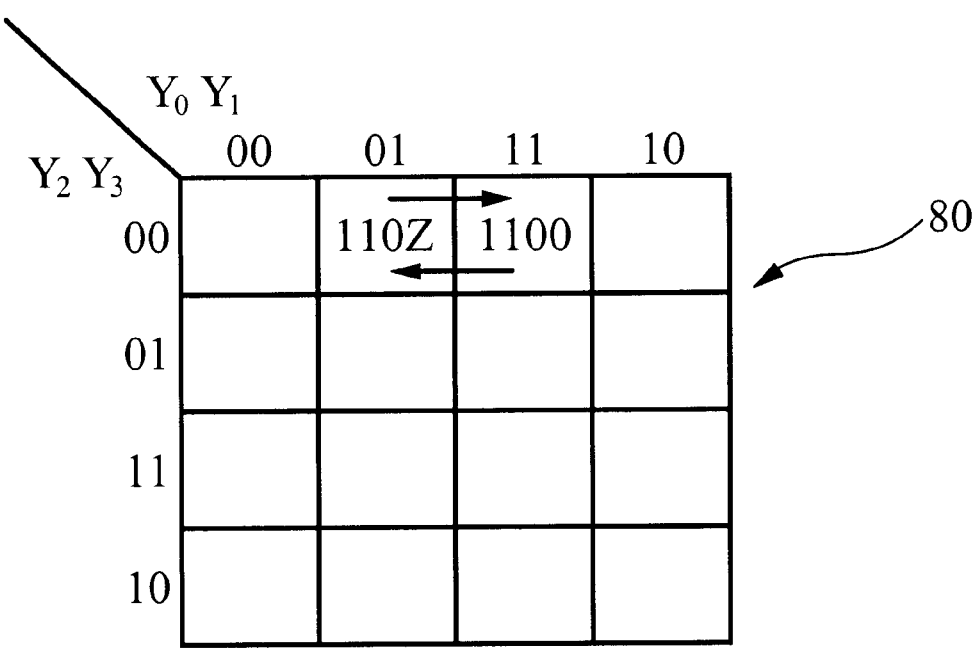
FIG. 7 is the illustration of how the SERT-1 resists to an SEU event.

Second, referring to FIG. 7, the simplified state table 80, when 0100 changes back to 1100. The second state transition occurs once the SEU event is concluded. The 0 levels on the nodes $y_2$ and $y_3$ have held active the PMOS transistors that will bring $y_0$ back to a 1. See state equations [1] and [2]. At this time $y_0$ rises and the circuit returns to the stable 1100 state, with all output terminals actively driven to the desired level.

Figure 8:
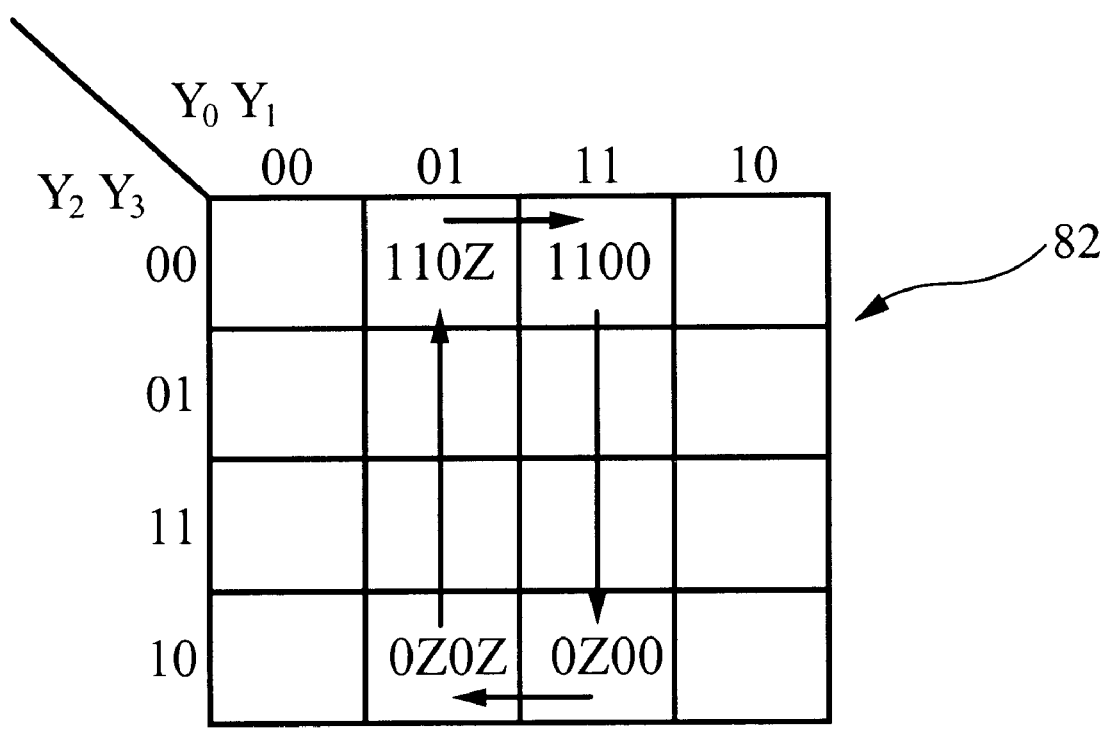
FIG. 8 is another illustration of how the SERT-1 resists a different SEU event.

The second SEU correction situation occurs when the SEU event forces the circuit to transition through a set of states and finally returns to the stable state. Assume again that the circuit is in state $y_0y_1y_2y_3=1100$. Assume an SEU causes $y_2$ to be transitioned from 0 to 1. In this case, four state transitions are needed to bring the circuit back to its original stable state, as shown in FIG. 8, a simplified SERT-1 State Table 82. In the second correction situation, four stages of transitions occur:

In the first stage, 1100 is changed to 1110. The first transition occurs immediately as a result of the charge injected by the SEU.

In the second stage, 1110 changes to 0110 because the next state of 1110 is 0Z00. See FIG. 6, table 70. The SEU event on the node $y_2$ keeps the node $y_2$ in the high (1) state. The node $y_1$ remains at the logic high level 1, the next state is therefore 0110. The low level on the node $y_2$, as seen in the state equation for $y_0$, causes $y_0$ to assume a value of 0. The node $y_2$ is excited to a 0 by the 1 on the node $y_1$ but this change cannot occur during the SEU event. In addition, the 1 value on $y_2$ causes $y_1$ to enter the high impedance state as indicated by the next state value of 0Z00 for a current state of 1110, but this node remains at the 1 level. Thus, the circuit enters state 0110. In the state 0110 $y_3$ goes to the high impedance state and the next state excitation is 0Z0Z so the circuit is stable until the SEU effect is removed.

In the third stage, the state 0110 is changed to 0100. When the SEU is removed the 1 level on the output terminal $y_1$ will cause the NMOS circuit of $y_2$ ($y_{,1}(0)$) to bring $y_2$ to a 0, forcing the circuit to 0100 which has a next state entry of 110Z. Since $y_3$ is at a 0 level the next state is effectively 1100.

In the fourth stage, the state 0100 is changed to 1100. In the final transition $y_0$ is excited to a 1 by the 0 levels on $y_2$ and $y_3$. The 1 on $y_0$ causes $y_3$ to be actively driven to 0, returning the circuit to the stable 1100 state and the circuit has recovered from the SEU.

Alternative Embodiments

It is to be understood that even though various embodiments of the present invention have been set forth in the foregoing description, the above disclosure is illustrative only, and changes may be made in detail, yet remain within the broad principles of the invention.

The second embodiment SERT-2 is very similar to the first embodiment discussed above. SERT-2 works exactly the same way as SERT-1 and can also recover from an SEU event in the same way as the first embodiment. The second embodiment SERT-2 replaces each NMOS transistor with a PMOS transistor and replaces each PMOS transistor with an NMOS transistor. The SERT-2 embodiment has cross-coupled 8 NMOS transistors and 4 PMOS transistors, while SERT-1 has only 4 NMOS transistors. Because SERT-2 has two NMOS transistors in series rather than two PMOS transistors in series, it may operate faster than SERT-1.

SERT-2 comprises a first circuit module 90 electrically coupled to a second circuit module 100. The first circuit module 90 has four cross-coupled n-channel (NMOS) transistors which are coupled to two p-channel (PMOS) transistors. The first circuit module 90 has two output terminals. The second circuit module 100 has four cross-coupled n-channel (NMOS) transistors which are coupled to two p-channel (PMOS) transistors. The second circuit module 100 has two output terminals coupled as inputs to the first circuit module 90.

In particular, the first circuit module 90 comprises four cross-coupled n-channel (NMOS) transistors coupled to two n-channel (PMOS) transistors. The four cross-coupled n-channel NMOS transistors include a first NMOS transistor 92, a second NMOS transistor 93 having its source coupled to a ground potential, its drain coupled to the source of the first NMOS transistor 92; a third NMOS transistor 95 having its gate coupled to the gate of the second NMOS transistor 93; and a fourth NMOS transistor 96 having its source coupled to the ground potential, its gate coupled to the gate of the first NMOS transistor 92 and its drain coupled to the source of the third NMOS transistor 95.

The first circuit module 90 also includes two p-channel (PMOS) transistors. A first PMOS transistor 91 having its source coupled to a power supply potential, its drain coupled to the drain of the first NMOS transistor 92 forming a first output terminal $y_0$, and its gate coupled to the gate of the first NMOS transistor 92. A second PMOS transistor 94 has its source coupled to the power supply potential, its drain coupled to the drain of the third NMOS transistor 95 forming a second output terminal $y_1$, and its gate coupled to the gate of the third NMOS transistor 95.

The second circuit module 100 is preferably structurally the same as the first circuit module 90.

The second circuit module 100 comprises four cross-coupled n-channel (NMOS) transistors which are coupled to two p-channel (PMOS) transistors. The four cross-coupled n-channel NMOS transistors include a fifth NMOS transistor 102, a sixth NMOS transistor 103 having its source coupled to a ground potential, its drain coupled in series to the source of the fifth NMOS transistor 102; a seventh NMOS transistor 105 having its gate coupled to the gate of the sixth NMOS transistor 103; and an eighth NMOS transistor 106 having its source coupled to a ground potential, its gate coupled to the gate of the fifth NMOS transistor 102 and its drain coupled to the source of the seventh NMOS transistor 105.

The second circuit module 100 also includes two p-channel (PMOS) transistors. A third PMOS transistor 101 having its source coupled to the power supply potential, drain coupled to the drain of the fifth NMOS transistor 102 forming a first output terminal $y_2$, and its gate coupled to the gate of the eighth NMOS transistor 106. A fourth PMOS transistor 104 has its source coupled to the power supply potential, its drain coupled to the drain of the seventh NMOS transistor 105 forming a second output terminal $y_3$, and its gate coupled to the gate of the seventh NMOS transistor 105.

Finally, the first output terminal $y_0$ is coupled to the gate of the sixth NMOS transistor 103 of the second circuit module 100. The second output terminal $y_1$ is coupled to the gate of the eighth NMOS transistor 106 of the second circuit module 100. The third output terminal $y_2$ is coupled to the gate of the first NMOS transistor 91 of the first circuit module 90, and the fourth output terminal $y_3$ is coupled to the gate of the third NMOS transistor 95 of the first circuit module 90.

The output terminals are also called state variables and they satisfy the following set of state equations:

$$y_0 = y'_2(1) + y_2 y_3(0) \qquad [1]$$

$$y_1 = y'_3(1) + y_2 y_3(0) \qquad [2]$$

$$y_2 = y'_1(1) + y_0 y_1(0) \qquad [3]$$

$$y_3 = y'_0(1) + y_0 y_1(0). \qquad [4]$$

Figure 9:
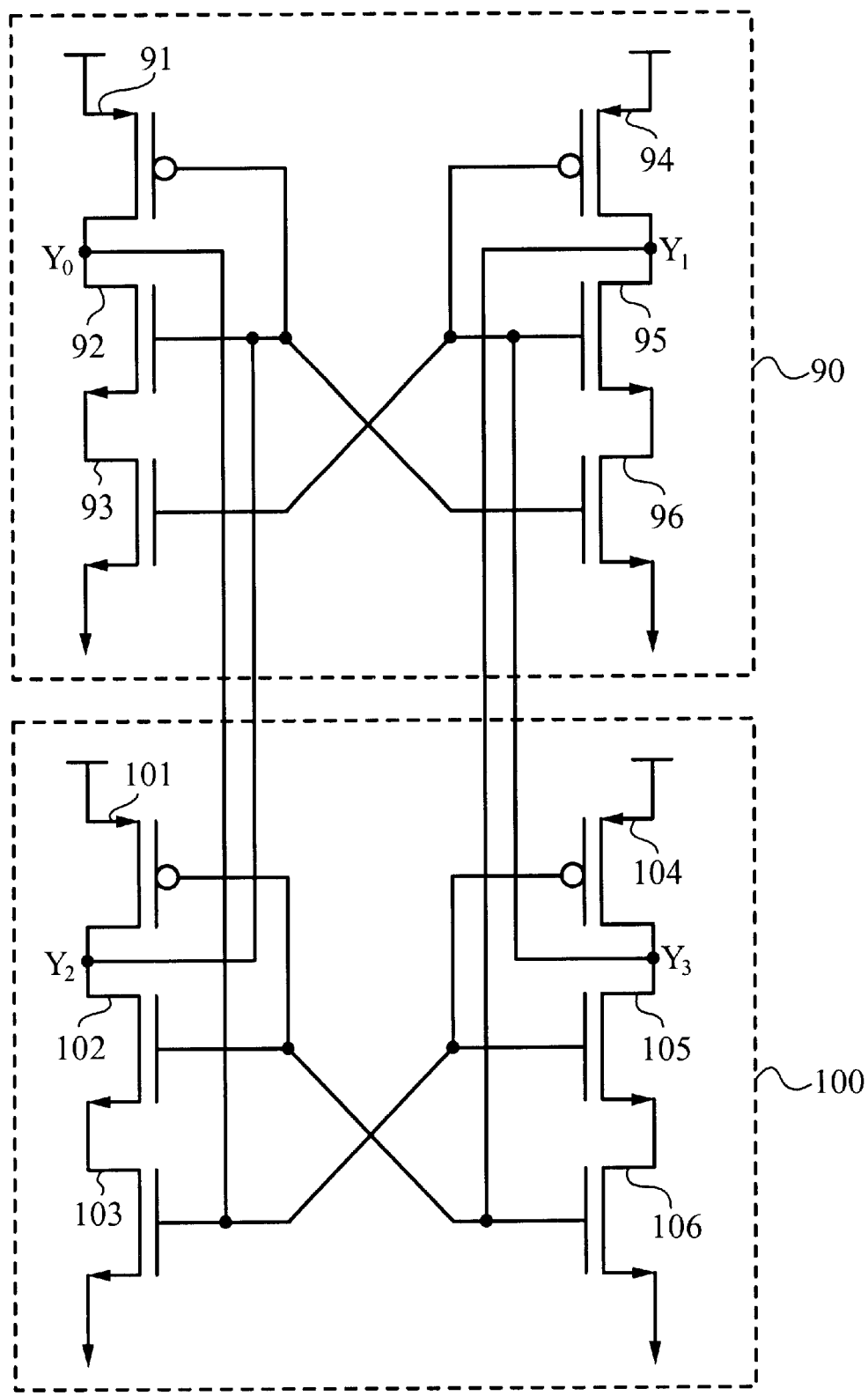
FIG. 9 is a schematic diagram of the second embodiment of the present invention or the SERT-2.

Whereas, $y_k'$ is the inverse of the state variable k, k=0,1,2,3. If $y_k$=1, then $y_k'$=0, and vice versa. A SERT-2 State Table can be obtained exactly the same way as in the analyses of the state equations and the schematic diagram shown in FIG. 9. The complete SERT-2 State Table is shown in FIG. 10.

RESULTS

In conventional CMOS design the substrate (p-well) region where the NMOS devices are constructed is electrically connected to the low logic level voltage supply and the n-well substrate region where the PMOS devices are constructed is electrically connected to the high level voltage supply. In twin tub processes both the NMOS and PMOS devices are constructed in wells with the electrical connections remaining consistent with that described above. Back-bias technology entails decoupling the substrate/well connections from the normal logic voltage levels and controlling the substrate/well voltages separately. By controlling the substrate/well voltages the effective thresholds of the NMOS and PMOS transistors, both drawn and parasitic, can be dynamically tuned. The constant of proportionality by which the change in transistor back-bias is translated into threshold voltage change is commonly known as the transistor body effect. As the back-bias voltage level is changed, the electric field across the induced channel to substrate p-n junction is changed. This electric field change in turn changes the junction drift current component. The drift current component change results in a change to the junction equilibrium diffusion current. The restoration of the MOSFET channel charge carriers that diffuse across the junction to the substrate is brought about as a change in MOSFET threshold voltage. Back-bias technology can result in lower supply voltages which may result in circuits that require less power.

The circuits of the present invention achieve conflict free operation with low power consumption and full logic levels. The design not only tolerates noise pulses on any output terminal but also works for any transient fault condition. It is not necessary to ratio transistors, except for the coupling input transistors controlled by the clock. Finally, the present invention requires fewer transistors than other known designs.

What is claimed is:

1. A Single Event Upset (SEU) resistant latch circuit SERT-1 comprising:

(a) a first circuit module having a first group of four cross-coupled p-channel (PMOS) transistors wherein a first and second p-channel transistor of the first group are coupled in series with a single first n-channel transistor such that the first p-channel transistor from the first group is coupled more closely to a positive voltage supply and a third and fourth p-channel transistor from the first group are coupled in series with a single second n-channel transistor such that the third p-channel transistor from the first group is coupled more closely to the positive voltage supply and further wherein the gate of the first p-channel transistor of the first group is connected to the gate of the fourth p-channel of the first group and the gate of the second p-channel transistor of the first group is connected to the gate of the third p-channel of the first group, and having two output terminals $y_0$, $y_1$, each output terminal having a low impedance logic 1 state, a low impedance logic 0 state, and a high impedance state Z, wherein the first and second n-channel (NMOS) transistors are connected directly to a ground potential; and (b) a second circuit module having a second group of four cross-coupled p-channel (PMOS) transistors wherein a first and second p-channel transistor of the second group are coupled in series with a single third n-channel transistor such that the first p-channel transistor from the second group is coupled more closely to a positive voltage supply and a third and fourth p-channel transistor from the second group are coupled in series with a single fourth n-channel transistor such that the third p-channel transistor from the second group is coupled more closely to the positive voltage supply and further wherein the gate of the first p-channel transistor of the second group is connected to the gate of the fourth p-channel of the second group and the gate of the second p-channel transistor of the second group is connected to the gate of the third p-channel of the second group and the second group is also coupled to the two output terminals of the first circuit module, and having two output terminals $y_2$, $y_3$ coupling to the four cross-coupled p-channel (PMOS) transistors of the first circuit module, each output terminal having a low impedance logic 1 state, a low impedance logic 0 state, and a high impedance state Z.

2. The single event resistant circuit as in claim 1, wherein the output terminals $y_0$, $y_1$, $y_2$, $y_3$ satisfy a set of state equations:

$y_0 = y'_2 y'_3(1) + y_2(0)$ $y_1 = y'_2 y'_3(1) + y_3(0)$ $y_2 = y'_0 y'_1(1) + y_1(0)$ $y_3 = y'_0 y'_1(1) + y_0(0)$, wherein $y_0'$, $y_1'$, $y_2'$, $y_3'$ are logic inversions of the output terminals $y_0$, $y_1$, $y_2$, $y_3$.

3. The SEU resistant latch circuit comprises first and second circuit modules, wherein the first circuit module comprises:

a) four cross-coupled p-channel (PMOS) transistors, wherein each of the transistors has a source, a drain, and a gate, comprising:
(1) a first PMOS transistor having its source coupled to a power supply potential;
(2) a second PMOS transistor having its source coupled to the drain of the first PMOS transistor;
(3) a third PMOS transistor having its source coupled to the power supply potential, its gate is coupled to the gate of the second PMOS transistor;
(4) a fourth PMOS transistor having its source coupled to the drain of the third PMOS transistor, its gate coupled to the gate of the first PMOS transistor;

(b) two n-channel (NMOS) transistors, wherein each of the transistors has a drain, a gate, and a source, comprising:
(1) a first NMOS transistor having its source coupled to the ground potential, its drain coupled to the drain of the second PMOS transistor forming a first output terminal $y_0$, and its gate coupled to the gate of the second PMOS transistor; and
(2) a second NMOS transistor having its source coupled to the ground potential, its drain coupled to the drain of the fourth PMOS transistor forming a second output terminal $y_1$, and its gate coupled to the gate of the fourth PMOS transistor;

wherein the second circuit module comprises:
c) four cross-coupled p-channel (PMOS) transistors, wherein each of the transistors has a source, a drain, and a gate, comprising:
(1) a first PMOS transistor having its source coupled to the power supply potential;
(2) a second PMOS transistor having its source coupled to the drain of the first PMOS transistor;
(3) a third PMOS transistor having its source coupled to the power supply potential, its gate is coupled to the gate of the second PMOS transistor;
(4) a fourth PMOS transistor having its source coupled to the drain of the third PMOS transistor, its gate coupled to the gate of the first PMOS transistor;

(d) two n-channel (NMOS) transistors, wherein each of the transistors has a drain, a gate, and a source, comprising:
(1) a first NMOS transistor having its source coupled to the ground potential, its drain coupled to the drain of the second PMOS transistor forming a third output terminal $y_2$, and its gate coupled to the gate of the second PMOS transistor; and
(2) a second NMOS transistor having its source coupled to the ground potential, its drain coupled to the drain of the fourth PMOS transistor forming a fourth output terminal $y_3$, and its gate coupled to the gate of the fourth PMOS transistor;

wherein the first output terminal $y_0$ is coupled to the gate of the first PMOS transistor of the second circuit module, the second output terminal $y_1$ is coupled to the gate of the third PMOS transistor of the second circuit module, third output terminal $y_2$ is coupled to the gate of the first NMOS transistor of the first circuit module, and the fourth output terminal $y_3$ is coupled to the gate of the second NMOS transistor of the first circuit module.

4. The single event resistant circuit as in claim 3, wherein the output terminals $y_0$, $y_1$, $y_2$, $y_3$ satisfy a set of state equations:

$y_0 = y'_2 y'_3(1) + y_2(0)$ $y_1 = y'_2 y'_3(1) + y_3(0)$ $y_2 = y'_0 y'_1(1) + y_1(0)$ $y_3 = y'_0 y'_1(1) + y_0(0)$, wherein $y_0'$, $y_1'$, $y_2'$, $y_3'$ are logic inversions of the output terminals $y_0$, $y_1$, $y_2$, $y_3$.

5. A Single Event Upset (SEU) resistant latch circuit SERT-2 comprising:
(a) a first circuit module having a first group of four cross-coupled n-channel (NMOS) transistors wherein a first and second n-channel transistor of the first group are coupled in series with a single first p-channel transistor such that the first n-channel transistor from the first group is coupled more closely to a ground potential and a third and fourth n-channel transistor from the first group are coupled in series with a single second p-channel transistor such that the third n-channel transistor from the first group is coupled more closely to the ground potential and further wherein the gate of the first n-channel transistor of the first group is connected to the gate of the fourth n-channel of the first group and the gate of the second n-channel transistor of the first group is connected to the gate of the third n-channel of the first group, and having two output terminals $y_0$, $y_1$, each output terminal having a low impedance logic 1 state, a low impedance logic 0 state, and a high impedance state Z, wherein the two p-channel (PMOS) transistors are connected directly to a power supply potential; and (b) a second circuit module having a second group of four cross-coupled n-channel (NMOS) transistors wherein a first and second n-channel transistor of the second group are coupled in series with a single third p-channel transistor such that the first n-channel transistor from the second group is coupled more closely to a ground potential and a third and fourth n-channel transistor from the second group are coupled in series with a single fourth p-channel transistor such that the third n-channel transistor from the second group is coupled more closely to the ground potential and further wherein the gate of the first n-channel transistor of the second group is connected to the gate of the fourth n-channel of the second group and the gate of the second n-channel transistor of the second group is connected to the gate of the third n-channel of the second group, and the second group is also coupled to the two output terminals of the first circuit module, and having two output terminals $y_2$, $y_3$ coupling to the four cross-coupled n-channel (NMOS) transistors of the first circuit module, each output terminal having a low impedance logic 1 state, a low impedance logic 0 state, and a high impedance state Z.

6. The single event resistant circuit as in claim 5, wherein the output terminals $y_0$, $y_1$, $y_2$, $y_3$ satisfy a set of state equations:

$$y_0 = y'_2(1) + y_2 y_3(0)$$

$$y_1 = y'_3(1) + y_2 y_3(0)$$

$$y_2 = y'_1(1) + y_0 y_1(0)$$

$$y_3 = y'_0(1) + y_0 y_1(0),$$

wherein $y_0'$, $y_1'$, $y_2'$, $y_3'$ are logic inversions of the output terminals $y_0$, $y_1$, $y_2$, $y_3$.

7. The SEU resistant latch circuit comprises first and second circuit modules, wherein the first circuit module comprises:

a) four cross-coupled n-channel (NMOS) transistors, wherein each of the transistors has a source, a drain, and a gate, comprising:
(1) a first NMOS transistor;
(2) a second NMOS transistor having its source coupled to a ground potential, its drain coupled to the source of the first NMOS transistor;
(3) a third NMOS transistor having its gate coupled to the gate of the second NMOS transistor;
(4) a fourth NMOS transistor having its source coupled to the ground potential, its gate coupled to the gate of the first NMOS transistor; and its drain coupled to the source of the third NMOS transistor;

(b) two p-channel (PMOS) transistors, wherein each of the transistors has a drain, a gate, and a source, comprising:
(1) a first PMOS transistor having its source coupled to the power supply potential, its drain coupled to the drain of the first NMOS transistor forming a first output terminal $y_0$, and its gate coupled to the gate of the first NMOS transistor; and
(2) a second PMOS transistor having its source coupled to the power supply potential, its drain coupled to the drain of the third PMOS transistor forming a second output terminal $y_1$, and its gate coupled to the gate of the third NMOS transistor;

wherein the second circuit module comprises:

c) four cross-coupled n-channel (NMOS) transistors, wherein each of the transistors has a source, a drain, and a gate, comprising:
(1) a first NMOS transistor;
(2) a second NMOS transistor having its source coupled to the ground potential, its drain coupled to the source of the first NMOS transistor;
(3) a third NMOS transistor having its gate coupled to the gate of the second NMOS transistor;
(4) a fourth NMOS transistor having its source coupled to the ground potential, its gate coupled to the gate of the first NMOS transistor; and its drain coupled to the source of the third NMOS transistor (d) two p-channel (PMOS) transistors, wherein each of the transistors has a drain, a gate, and a source, comprising:
(1) a first PMOS transistor having its source coupled to the power supply potential, its drain coupled to the drain of the first NMOS transistor forming a third output terminal $y_2$, and its gate coupled to the gate of the first NMOS transistor; and
(2) a second PMOS transistor having its source coupled to the power supply potential, its drain coupled to the drain of the third PMOS transistor forming a fourth output terminal $y_3$, and its gate coupled to the gate of the third NMOS transistor;

wherein the first output terminal $y_0$ is coupled to the gate of the second NMOS transistor of the second circuit module, the second output terminal $y_1$ is coupled to the gate of the fourth NMOS transistor of the second circuit module, the third output terminal $y_2$ is coupled to the gate of the first NMOS transistor of the first circuit module, and the fourth output terminal $y_3$ is coupled to the gate of the third NMOS transistor of the first circuit module.

8. The single event resistant circuit as in claim 7, wherein the output terminals $y_0$, $y_1$, $y_2$, $y_3$ satisfy a set of state equations:

$$y_0 = y'_2(1) + y_2 y_3(0)$$

$$y_1 = y'_3(1) + y_2 y_3(0)$$

$$y_2 = y'_1(1) + y_0 y_1(0)$$

$$y_3 = y'_0(1) + y_0 y_1(0),$$

wherein $y_0'$, $y_1'$, $y_2'$, $y_3'$ are logic inversions of the output terminals $y_0$, $y_1$, $y_2$, $y_3$.

* * * * *

UNITED STATES PATENT AND TRADEMARK OFFICE
CERTIFICATE OF CORRECTION

PATENT NO. : 6,573,773 B2
DATED : June 3, 2003
INVENTOR(S) : Maki et al.

It is certified that error appears in the above-identified patent and that said Letters Patent is hereby corrected as shown below:

Column 7,
Line 3, replace "the next states are "1,1,1, corresponding" with -- the next states are 1,1,1,1 corresponding --.
Line 36, replace "terminal output y, to" with -- terminal output $y_1$ to --.

Signed and Sealed this

Seventh Day of October, 2003

JAMES E. ROGAN
*Director of the United States Patent and Trademark Office*